United States Patent [19]
Ikegami

[11] Patent Number: 5,953,273
[45] Date of Patent: Sep. 14, 1999

[54] SEMICONDUCTOR INTEGRATED CIRCUIT DEVICE HAVING CONFIRMABLE SELF-DIAGNOSTIC FUNCTION

[75] Inventor: Kayoko Ikegami, Tokyo, Japan

[73] Assignee: NEC Corporation, Tokyo, Japan

[21] Appl. No.: 09/085,059

[22] Filed: May 27, 1998

[30] Foreign Application Priority Data

May 29, 1997 [JP] Japan ................................. 9-139992

[51] Int. Cl.[6] .......................... G11C 7/00; G01R 31/26
[52] U.S. Cl. ........................................ 365/201; 371/22.1
[58] Field of Search .......................... 365/201; 371/22.1; 395/182.03, 183.18

[56] References Cited

U.S. PATENT DOCUMENTS

| | | | |
|---|---|---|---|
| 5,335,202 | 8/1994 | Manning et al. | 365/201 X |
| 5,712,575 | 1/1998 | Ma et al. | 365/201 X |
| 5,727,001 | 3/1998 | Loughmiller | 365/201 |

*Primary Examiner*—Huan Hoang
*Attorney, Agent, or Firm*—McGinn & Gibb, P.C.

[57] ABSTRACT

A semiconductor dynamic random access memory device enters into a test mode at a WE/CAS-Before-RAS timing, and selectively carries out self-diagnostic functions under application of a super voltage; when the super voltage is applied to a signal pin, a super voltage detecting circuit checks it to see whether the potential level exceeds the positive power voltage, and supplies a control signal representative of detection of the super voltage to a test control signal generating circuit for producing a test entry signal and to a data pin through a selector so as to allow an analyst to confirm the entry into the self-diagnostic function.

5 Claims, 9 Drawing Sheets

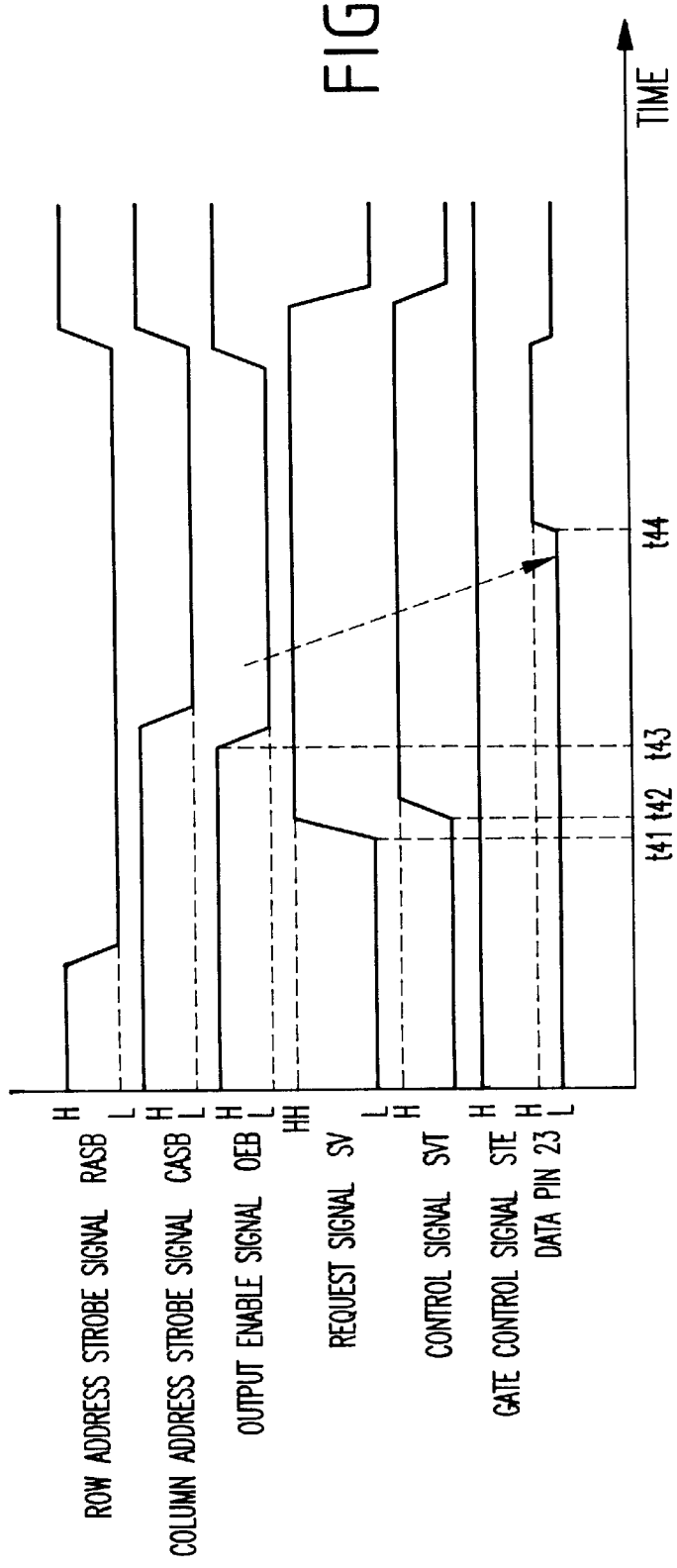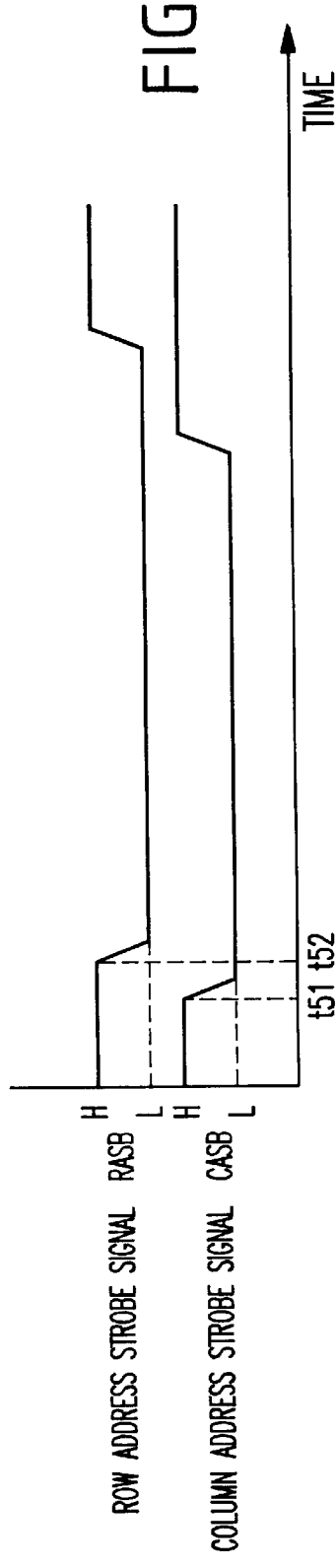

SEMICONDUCTOR INTEGRATED CIRCUIT DEVICE HAVING CONFIRMABLE SELF-DIAGNOSTIC FUNCTION

FIELD OF THE INVENTION

This invention relates to a semiconductor integrated circuit device and, more particularly, to a semiconductor integrated circuit device with a confirmable self-diagnostic function.

DESCRIPTION OF THE RELATED ART

A semiconductor integrated circuit device such as a semiconductor memory device has a test mode for a self-diagnostic function as well as a data write-in function and a data read-out function. When the self-diagnostic function is required, the semiconductor memory device enters into the test mode, and checks the components to see whether they are defective or non-defective. In order to discriminate a request for self-diagnostic function, a test mode entry circuit is incorporated in the semiconductor memory device. An operation mode for the data write-in function and the data read-out function is hereinbefore referred to as "standard mode".

FIG. 1 illustrates a typical example of the test mode entry circuit. The semiconductor memory device is fabricated on a semiconductor chip 1, and memory cells (not shown) and peripheral circuits are integrated on the semiconductor chip 1. Plural signal pins are connected to the peripheral circuits, and one of the signal pins T1 is shared between an address buffer circuit 2 and the prior art test mode entry circuit 3. An address signal A11 and a request signal SV for the self-diagnosing mode are supplied to the signal pin T1. The address signal A11 swings its voltage under the maximum rated voltage, and the request signal SV has a voltage level over the maximum rated voltage. The voltage level over the maximum rated voltage is hereinbelow referred to as "super voltage".

The test mode entry circuit 3 includes a super voltage detecting circuit 3a and a test control signal generating circuit 3b, and the super voltage detecting circuit 3a is connected between the signal pin T1 and the test control signal generating circuit 3b. The super voltage detecting circuit 3a discriminates the request signal SV from the address signal A11, and supplies a control signal SVT to the test control signal generating circuit 3b. The control signal SVT makes the test control signal generating circuit 3b responsive to selecting signals ADK6/ADK7, and the test control signal generating circuit 3b becomes responsive to the selecting signals ADK6/ADK7. The selecting signals ADK6/ADK7 are representative of a test function to be required, and the rest signal generating circuit 3b selectively generates test mode entry signals TEST1, TEST2, . . . The selecting signals ADK6/ADK7 are supplied to other signal pins, to which other address signals are supplied in the standard mode.

The prior art semiconductor memory device behaves as follows. FIG. 2A shows the behavior of the prior art semiconductor memory device in the standard mode. In the standard mode of operation, a row address strobe signal RASB is changed to an active low level at time t1, and the address buffer circuits latch address signals ADD representative of a row address XA. The row address XA is decoded by a row address decoder (not shown), and a word line (not shown) assigned the row address XA is changed to an active level. Then, memory cells (not shown) connected to the word line are electrically connected to bit line pairs, respectively. A column address strobe signal CASB and a write enable signal WEB are changed to an active low level at time t2, and the address signals ADD representative of a column address YA and a write-in data bit IN are supplied to the address buffer circuits and an input-and-output data pin I/O. The write-in data bits IN is supplied through a data bus (not shown) to a column selector (not shown), and a column address decoder (not shown) makes the column selector to connect the data bus to the bit line pair assigned the column address YA. Then, the write-n data bit IN is propagated to the memory cell, and is stored therein.

If the output enable signal OEB is chanced to the active low level at time t3 and the write enable signal WEB remains at the high level, the read-out data bit is transferred from the bit line pair assigned the column address YA through the column selector to the data bus, and the read-out data bit is supplied from the input-and-output data pin I/O to a destination. The address signals swings their voltage levels under the maximum rated voltage, and the signal pin T1 is used for receiving one of the address signals A11 in the standard mode.

On the other hand, the prior art semiconductor memory device enters into the test mode as follows. FIG. 2B shows the behavior of the prior art semiconductor memory device in the test mode.

First, the column address strobe signal CASB and the write enable signal WEB are changed to the active low level at time t10, and the row address strobe signal RASB is changed to the active low level at time t11. Thus, the column address strobe signal CASB, the write enable signal WEB and the row address strobe signal RASB are changed to the low level in the different order from those in the standard mode, and the control sequence is called as "WCBR (WE/CAS-Before-RAS) timing". Another prior art semiconductor memory device enters into the test mode at "CBR (CAS-Before-RAS) timing.

The request signal SV is supplied through the signal pin A11 to the super voltage detecting circuit 3a at time t12, and the super voltage detecting circuit 3a changes the control signal SVT to the active high level at time t13. The column address strobe signal CASB is recovered to the inactive high level at time t14, and is changed to the active low level at time t15, again. Then, the selecting signals ADK6/ADK7 are latched, and are transferred to the test control signal generating circuit 3b. The test control signal generating circuit 3b has been already enabled with the control signal SVT, and decodes the selecting signals ADK6/ADK7 for selectively generating test control signals TEST1, TEST2, . . . The self-diagnostic function starts with the test control signal TEST1, TEST2, . . . , and the memory cells are, by way of example, diagnosed.

Potential levels are, by way of example, changed in the self-diagnostic function. If the self-diagnosis is carried out for the memory cells, the potential level at the counter electrodes of storage capacitors is changed from that in the standard mode. In other words, abnormal environment is created in the self-diagnostic function.

The request signal SV of the super voltage is not used for a factory inspection such as a selection between defective products and non-defective products carried out after the fabrication process. Although external signals are supplied to the semiconductor memory device as similar to the standard mode, the semiconductor memory device is not allowed to enter into the test mode without the super voltage. Even if the semiconductor memory device mistakenly enters into the self-diagnostic mode, the output signal is output from a predetermined signal pin only, and any output signal is never output from the other signal pins. The unintentional entry is easily found, and the change between the standard mode and the self-diagnostic mode is only dependent on the voltage level at the signal pin T1. On the other hand, the factory inspection requires certainty, and the super voltage is not used for the entry into the test mode. The semiconductor memory device outputs signals from all the output signal pins, and a tester judges the semiconductor memory device whether or not it has entered into the factory inspection mode on the basis of the output signal pattern. A control signal ΦA is changed to the active high level at the fall of the column address strobe signal CASB at time t15, and a control signal ΦB is changed to the active low level at the WE/CAS-Before-RAS timing. The control signals (ΦA and (ΦB give appropriate timings to the test control signal generating circuit 3b, and are described in connection with the circuit configuration of the test control signal generating circuit 3b.

FIG. 3 illustrates the circuit configuration of the super voltage detecting circuit 3a, and FIG. 4 illustrates the circuit configuration of the test control signal generating circuit 3b. The super voltage detecting circuit 3a includes a NAND gate NA1, a series of inverters INV1/INV2/INV3 connected to the output node of the NAND gate NA1, an inverter INV4 connected between a power-on detector (not shown) and an input node of the NAND gate NA1, a series of n-channel type load transistors Mn14/Mn15/Mn16 connected between the signal pin T1 and the other input node of the NAND gate NA1 and a voltage clamping circuit 4 connected between the other input node and a ground line GND. The voltage clamping circuit 1 is implemented by a series of n-channel type field effect transistors Mn14/Mn15/Mn16/Mn17, and a positive power voltage line VD is connected to the gate electrodes of the n-channel type field effect transistors Mn14 to Mn17. The voltage clamping circuit clamps the input node N11 at the positive power voltage level Vdd.

The super voltage detecting circuit 3a behaves as follows. While the power voltage is rising, the power-on detector maintains a power-on signal PON at high level. When the power voltage reaches a certain level, the power-on detector changes the power-on signal PON to the ground level. The power-on signal PON is inverted by the inverter INV4, and the complementary power-on signal PONB is supplied to the NAND gate NA1. When the power voltage reaches the certain level, the inverter INV4 changes the complementary power-on signal PONB to the high level, and the NAND gate NA1 is enabled with the complementary power-on signal PONB.

The n-channel type load transistors Mn11/Mn12/Mn13 have a threshold Vth, and each of the n-channel type load transistors Mn11/Mn12/Mn13 steps down the potential level by the threshold Vth. The potential level at the signal pin T1 is delayed by three times the threshold Vth. For this reason, the it is necessary for the request signal SV to be higher than the positive power voltage Vdd by at least three times the threshold voltage Vth. If the potential level at the node N11 is lower than the positive power voltage level Vdd, the NAND gate NA1 yields an output signal of the high level, and the inverter INV3 maintains the control signal SVT at the inactive low level.

On the other hand, when the request signal SV is supplied to the signal pin T1, the request signal SV is three times stepped down from the super voltage to the positive power voltage Vdd, and the NAND gate NA1 changes the output signal to the low level. As a result, the inverter INV3 changes the control signal SVT to the high level, and the test control signal generating circuit 3b is enabled.

The circuit configuration of the test control signal generating circuit 3b is shown in FIG. 4. The test control signal generating circuit 3b largely comprises a decoder 5, a latch circuit 6, a timing generator 7 and a signal driver 8. The decoder 5 includes two inverters INV5/INV6 and four NAND gates NA2/NA3/NA4/NA5. The selecting signals ADK6/ADK7 are supplied to the signal pins assigned to the address signals, and are latched at the change of the control signal ΦA to the active high level. The inverters INV5/INV6 produce complementary selecting signals, and the selecting signals ADK6/ADK7 and the complementary selecting signals are selectively supplied to the NAND gates NA2 to NA5. One of the NAND gates NA2 to NA5 changes the output signal to the low level, and the other NAND gates keep the output signals high.

The latch circuit 6 includes an inverter INV7, a memory loop 6a for storing the control signal SVT, a transfer gate or a parallel combination of an n-channel enhancement type field effect transistor Mn18 and a p-channel enhancement type field effect transistor Mp1 connected between the inverter INV7 and the memory loop 6a and an inverter INV8. The inverter INV7 produces a complementary control signal SVTB, and the inverter INV8 produces a complementary control signal Φ BB from the control signal (Φ B. The control signal (Φ B is supplied to the gate electrode of the p-channel type field effect transistor Mp1, and the complementary control signal (Φ BB is supplied to the gate electrode of the n-channel type field effect transistor Mn18. For this reason, the p-channel type field effect transistor Mp1 and the n-channel type field effect transistor Mn18 are concurrently changed between on-state and off-state. The control signal Φ B is changed to the active low level at the WE/CAS-Before-RAS timing (see FIG. 2B), and causes the transfer gate to turn on. The memory loop 6a is implemented by a NOR gate NR1 and an inverter INV9, and the power-on signal PON is supplied to the input node of the NOR gate NR1. The output node of the NOR gate NR1 is connected to the input node of the inverter INV9, and the output node of the inverter INV9 is connected to the other input node of the NOR gate NR1. As described hereinbefore, when the power voltage Vdd reaches the certain level, the power-on signal PON is changed to the low level, and enables the NOR gate NR1. For this reason, the control signal SVT representative of the request for the self-diagnostic function is latched by the latch circuit 6 at the CAS-Before-RAS timing.

The timing generator 7 includes an inverter INV10 and NAND gates NA6/NA7. The NOR gate NR1 supplies the control signal SVT to an input node of the NAND gate NA6 and the inverter INV10. The inverter INV10 produces a complementary control signal SVTB from the control signal SVT, and supplies the complementary control signal SVTB to an input node of the other NAND gate NA7. The control signal Φ A is produced at the second fall of the column address strobe signal CASB (see FIG. 2B), and the makes the NAND gates NA6/NA7 enable. The NAND gates NA6/NA7 invert the control signal SVT or the complementary control signal SVTB, respectively, and complimentarily change enable signals EBL1 and EBL2 to the active low level. Thus, the timing control circuit 7 selectively changes the enable signals EBL1/EBL2 to the active low level at the second fall of the column address strobe signal CASB in the test mode depending upon the potential level of the request signal SV.

The signal driver 8 includes four NOR gates NR2/NR3/NR4/NR5 and series combinations of inverters INV11/INV12, INV13/INV14, INV15/INV16 and INV17/INV18 connected to the output nodes of the NOR gates NR2/NR3/

NR4/NR5, respectively. The enable signal EBL1 is supplied to the NOR gates NR2/NR3, and the other enable signal EBL2 is supplied to the NOR gates NR4/NR5, and NOR gates NR2/NR3 or the NOR gates NR4/NR5 become responsive to the output signals of the associated NAND gates NA2/NA3 or NA4/NA5. With the output signals of the decoder 5, the test control signals TEST1, TEST2, TEST3 and TEST4 are selectively changed to the active high level. For example, if the selecting signals ADK6/ADK7 are in the low level and the requesting signal SV is in the super voltage, the NAND gate NA6 is enabled with the control signal ($\Phi$ A at the second fall of the column address strobe signal CASB, and the selecting signals ADK6/ADK7 cause the NAND gate NA2 to change the output signal to the low level. Then, the NOR gate NR2 changes the output signal to the high level, and the inverter INV12 changes the test control signal TEST1 to the active high level.

As described hereinbefore, the prior art semiconductor integrated circuit with a self-diagnostic function enters into the test mode at the WE/CAS-Before-RAS timing, and is branched into the self-diagnostic functions TEST1 and TEST2 in the presence of the super voltage at the signal pin T1. In other words, the prior art semiconductor integrated circuit device selects a self-diagnostic function to be executed on the basis of the potential level at the signal pin T1 and the combination of selecting signals ADK6/ADK7. For this reason, the prior art semiconductor integrated circuit device is equipped with the super voltage detecting circuit 3a, and the super voltage detecting circuit 3a determines the potential level at the signal pin T1 whether it is the super voltage or not.

The super voltage detecting circuit can not directly measure the super voltage. The potential level at the signal pin T1 is stepped down through the series of load transistors Mn11 to Mn13, and the threshold of the NAND gate NA1 is adjusted to a certain level lower than the super voltage by thee times the threshold Vth. However, the threshold of the n-channel type load transistors Mn11 to Mn13 is not always adjusted to the appropriate value. If the fabrication process undesirably fluctuates, the n-channel type load transistors Mn11 to Mn13 may have a threshold larger than the threshold Vth. In this situation, even though the super voltage is applied to the signal pin T1, the potential level is widely stepped down, and the NAND gate NA1 does not change the output level to the low level. For this reason, the prior art semiconductor memory device does not carry out the self-diagnostic function to be requested. The prior art semiconductor memory device carries out another diagnostic function, and an analyst does not notice the execution of another diagnostic function. This is the first problem inherent in the prior art semiconductor memory device.

Another problem is that destruction of the super voltage detecting circuit. The component transistors of a semiconductor integrated circuit device have been miniaturized, and the gate insulating layer is extremely thin. This means that the component transistors such as Mn11 to Mn13 are liable to be broken down under the super voltage. If the manufacturer determines the super voltage much higher than the positive power voltage Vdd, the first problem may be solved. However, such a super voltage is liable to damage the thin gate insulating layer. This is the second problem, and there is a trade-off between the first problem and the second problem.

SUMMARY OF THE INVENTION

It is therefore an important object of the present invention to provide a semiconductor integrated circuit device, which surely carries out a self-diagnostic function under application of a super voltage without destruction of component elements.

To accomplish the object, the present invention proposes to output a control signal SVT representative of application of the super voltage from a signal pin.

In accordance with one aspect of the present invention, there is provided a semiconductor integrated circuit device having a test mode and a standard mode and comprising an internal circuit carrying out a task in the standard mode and diagnosed in the test mode, and having a signal source for producing a data signal and a signal port, a super voltage detecting circuit checking a first external signal to see whether or not the first external signal is out of a regular potential range, and producing a first control signal when the first external signal is out of the regular potential range, a test control signal generating circuit responsive to second external signals for producing a test entry signal representative of a self-diagnostic function in the presence of the first control signal and for producing a second control signal changed between a first level and a second level in the absence of the first control signal and a selector having a first port connected to the signal source, a second port connected to the super voltage detecting circuit and a third port connected to the signal port, and responsive to the second control signal for selectively transferring the data signal and the first control signal to the signal port.

BRIEF DESCRIPTION OF THE DRAWINGS

The features and advantages of the semiconductor integrated circuit device will be more clearly understood from the following description taken in conjunction with the accompanying drawings in which:

FIG. 8B is a timing chart showing a confirmation of super voltage, and

FIG. 8C is a timing chart showing an exit from the test mode.

DESCRIPTION OF THE PREFERRED EMBODIMENT

Figure 5:
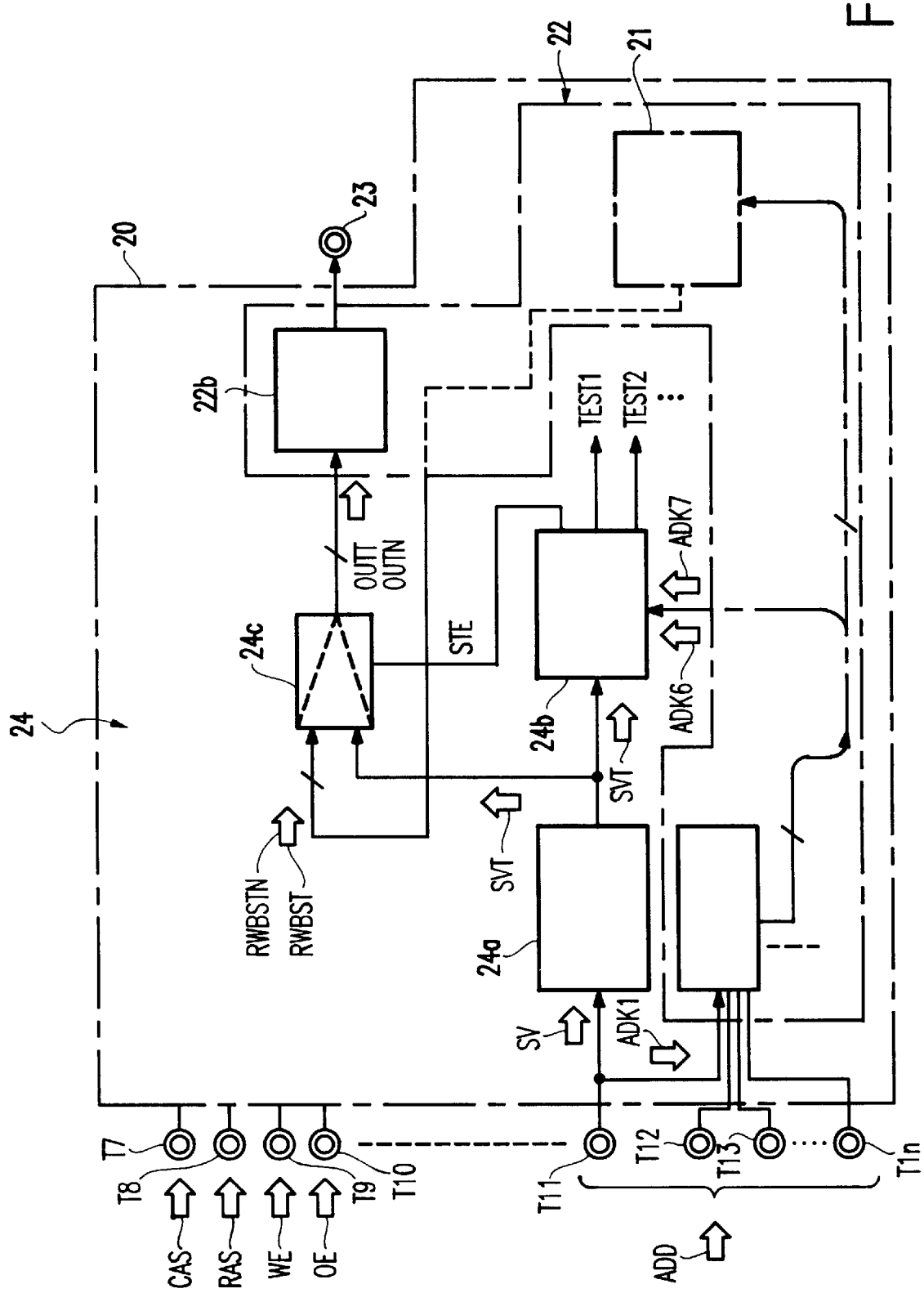
FIG. 5 is a block diagram showing the circuit arrangement of a semiconductor memory device according to the present invention.

Referring to FIG. 5 of the drawings, a semiconductor memory device embodying the present invention is integrated on a semiconductor chip 20. The semiconductor memory device comprises a memory cell array 21 and peripheral circuits 22. The memory cell array 21 is implemented by dynamic random access memory cells of type having one-transistor and one-capacitor, and data bits are respectively stored in the dynamic random access memory cells in the form of electric charge. Address buffers 22a row address decoder (not shown), a column address decoder (not shown), a word line driver (not shown), a column selector (not shown), a sense amplifier (not shown), a controller (not shown) and a data buffer 22b are incorporated in the peripheral circuits. Signal pins T7, T8, T9 and T10 are connected to the controller, and a column address strobe signal CAS, a row address strobe signal RAS, a write enable signal WE and an output enable signal OE are supplied to the signal pins T7, T8 and T9. Other signal pins T11, T12, T13, . . . T1n are connected to the address buffers 22a, and an address signal ADD is supplied to the signal pins T11 to T1n. The peripheral circuits 22 select dynamic random access memory cell or cells from the array 21, and transfer data bit or bits between the selected dynamic random access memory cells and a data port 23. The dynamic random access memory cells and the peripheral circuits are well known to a person skilled in the art, and no further description is incorporated hereinbelow. The peripheral circuits 22 assist a data read-out from the memory cell array 21 and a data write into the memory cell array 21, and the operation mode for the data read-out and the data write-in is referred to as "standard mode".

The semiconductor memory device further comprises a test controller 24 for selectively carrying out testing functions. The operation mode for the testing functions is referred to as "test mode". The test controller 24 includes a super voltage detecting circuit 24a, a test control signal generating circuit 3b and a selector 24c. The signal pin T11 is shared between the super voltage detecting circuit 24a and the address buffers 22a, and a request signal SV of the super voltage is supplied through the signal pin T11 to the super voltage detecting circuit 24a. The super voltage detecting circuit 24a is similar in circuit configuration to the super voltage detecting circuit 3a, and no further description is incorporated hereinbelow.

Figure 1:
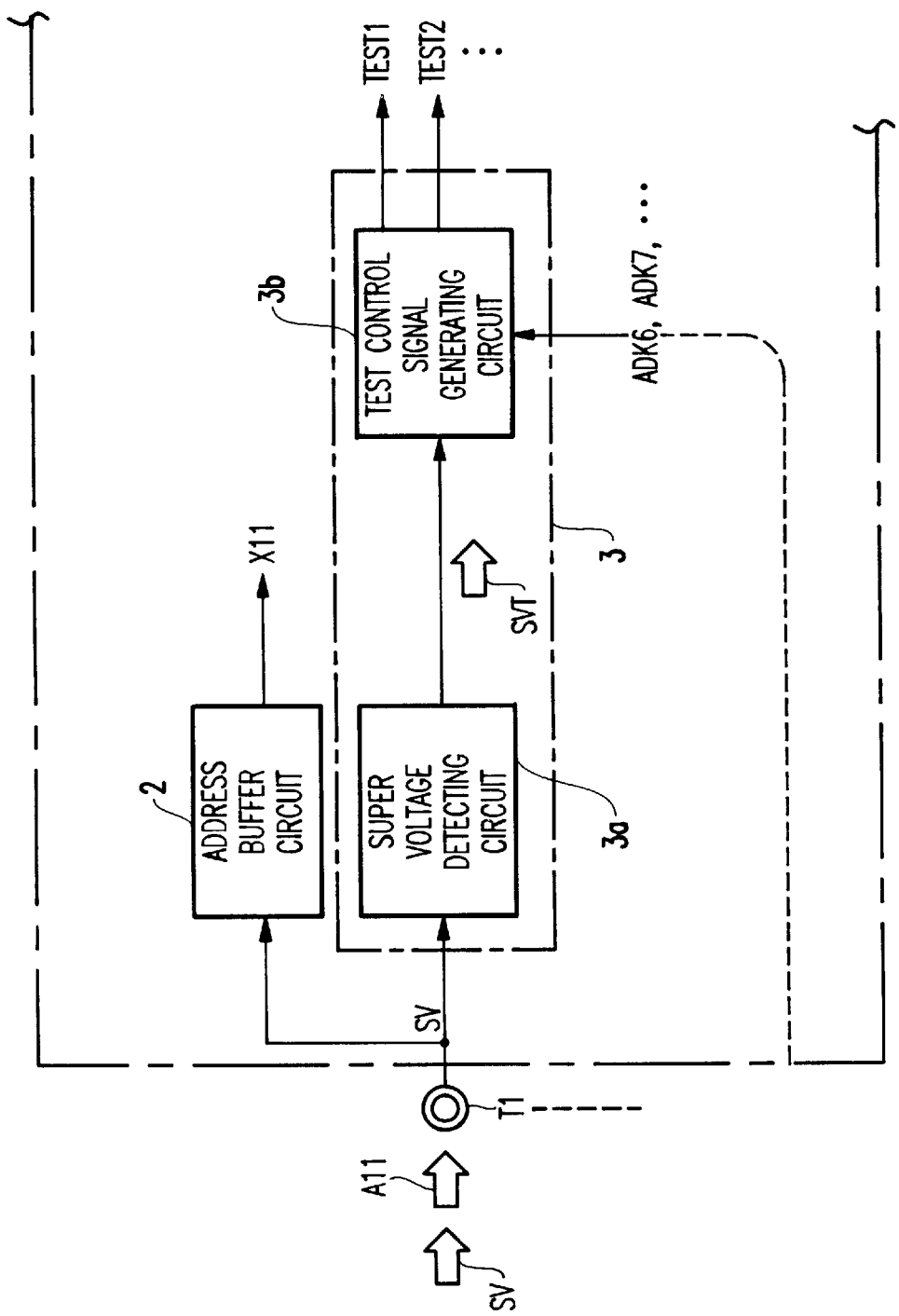
FIG. 1 is a block diagram showing the prior art test mode entry circuit incorporated in the semiconductor memory device.
Figure 2A:
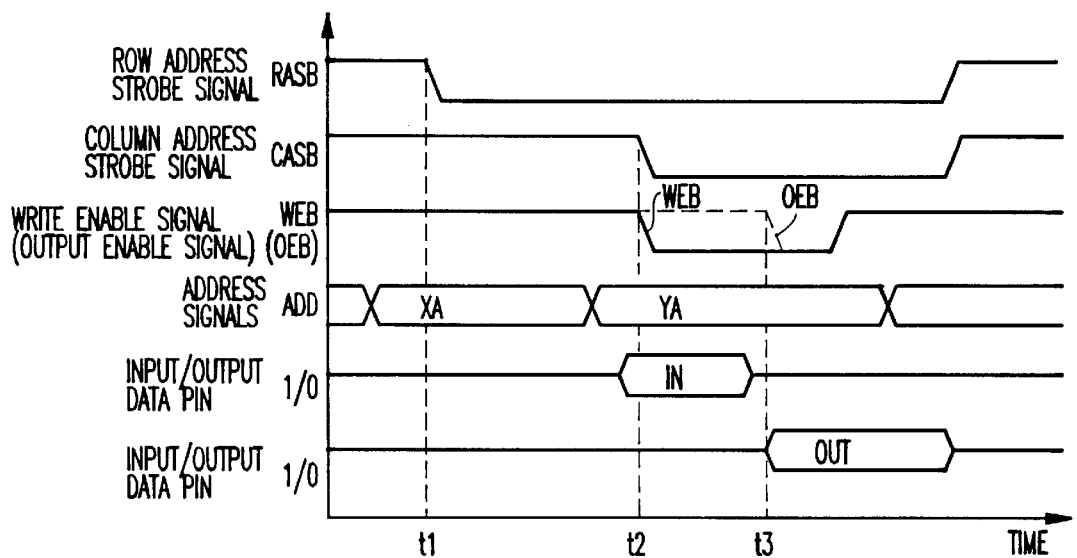
FIG. 2A is a timing chart showing the behavior of the prior art semiconductor memory device in the standard operation mode.
Figure 2B:
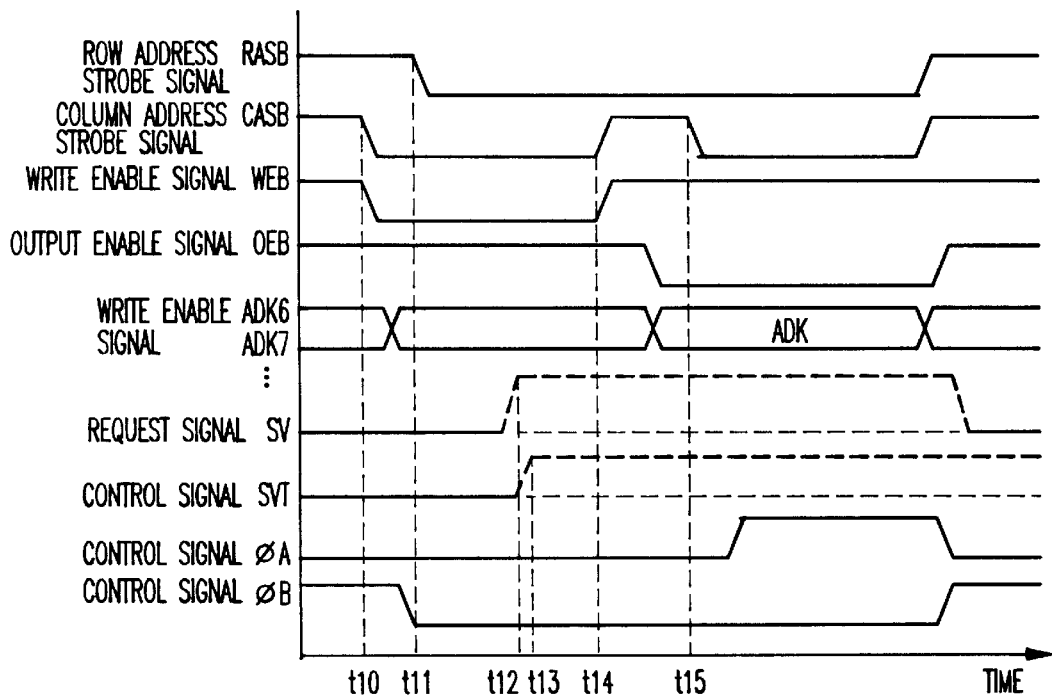
FIG. 2B is a timing chart showing the behavior of the prior art semiconductor memory device in the self-diagnostic mode.
Figure 3:
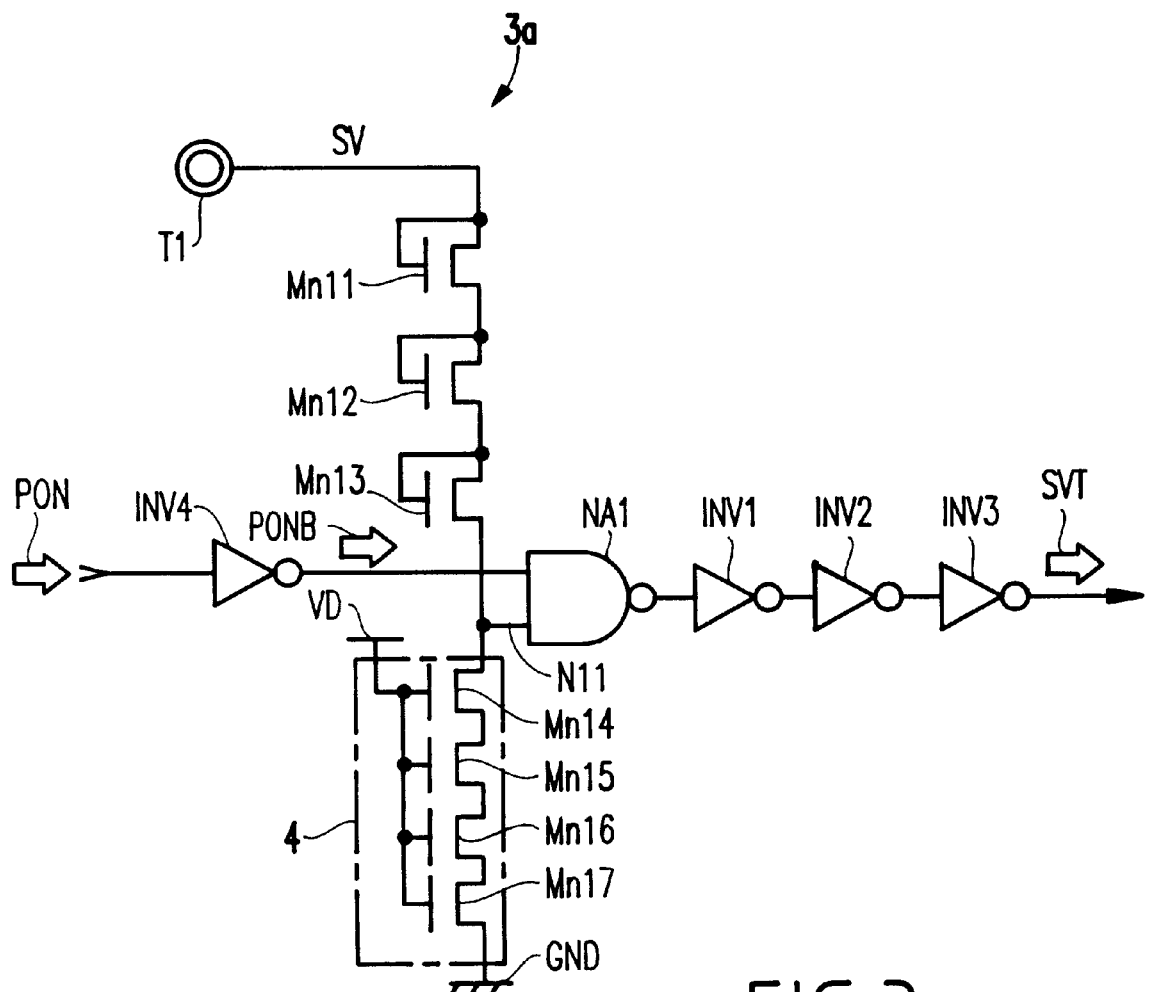
FIG. 3 is a circuit diagram showing the circuit configuration of the super voltage detecting circuit incorporated in the prior art semiconductor memory device.
Figure 4:
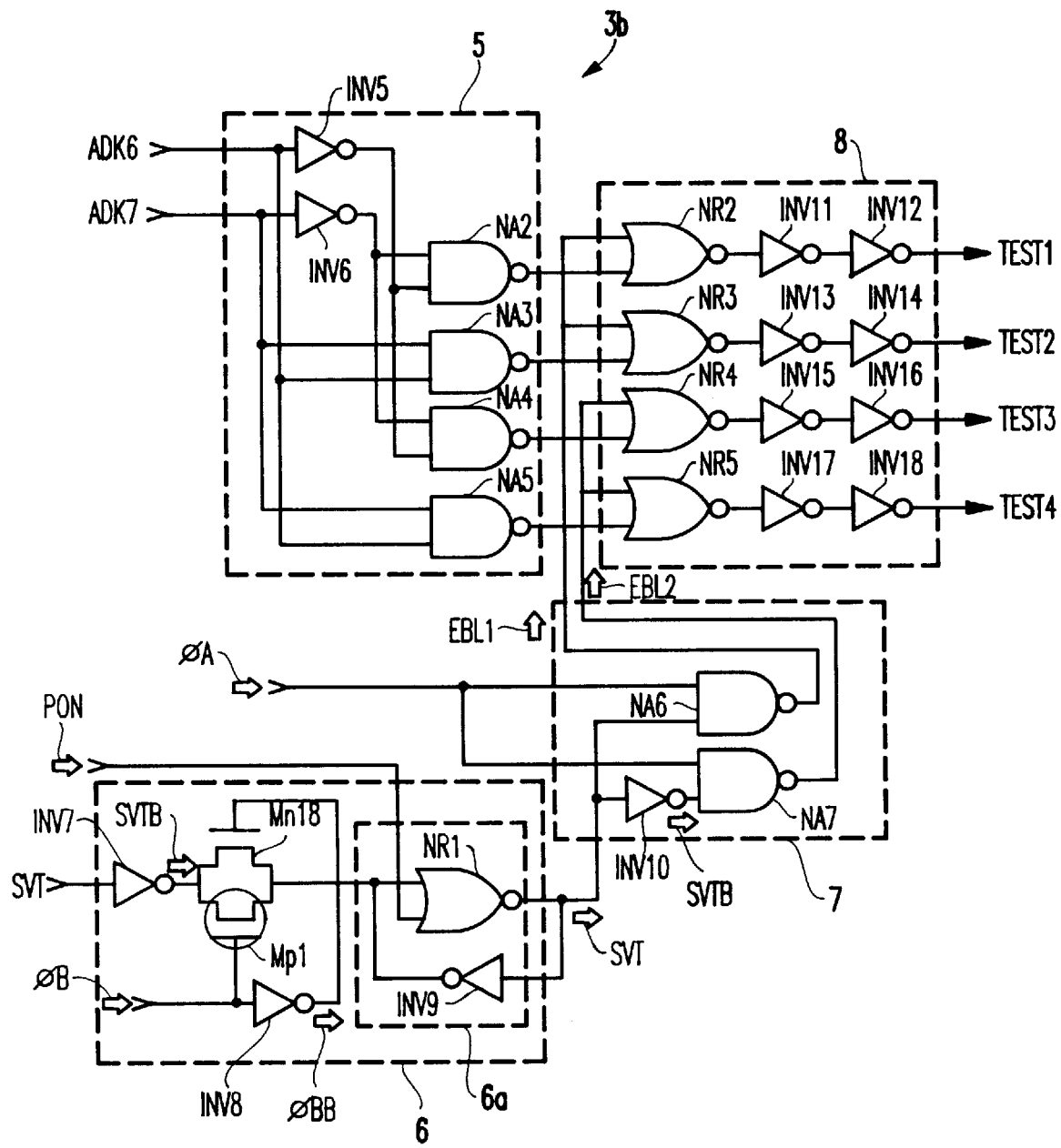
FIG. 4 is a circuit diagram showing the circuit configuration of the test control signal generating circuit incorporated in the prior art semiconductor memory device.
Figure 6:
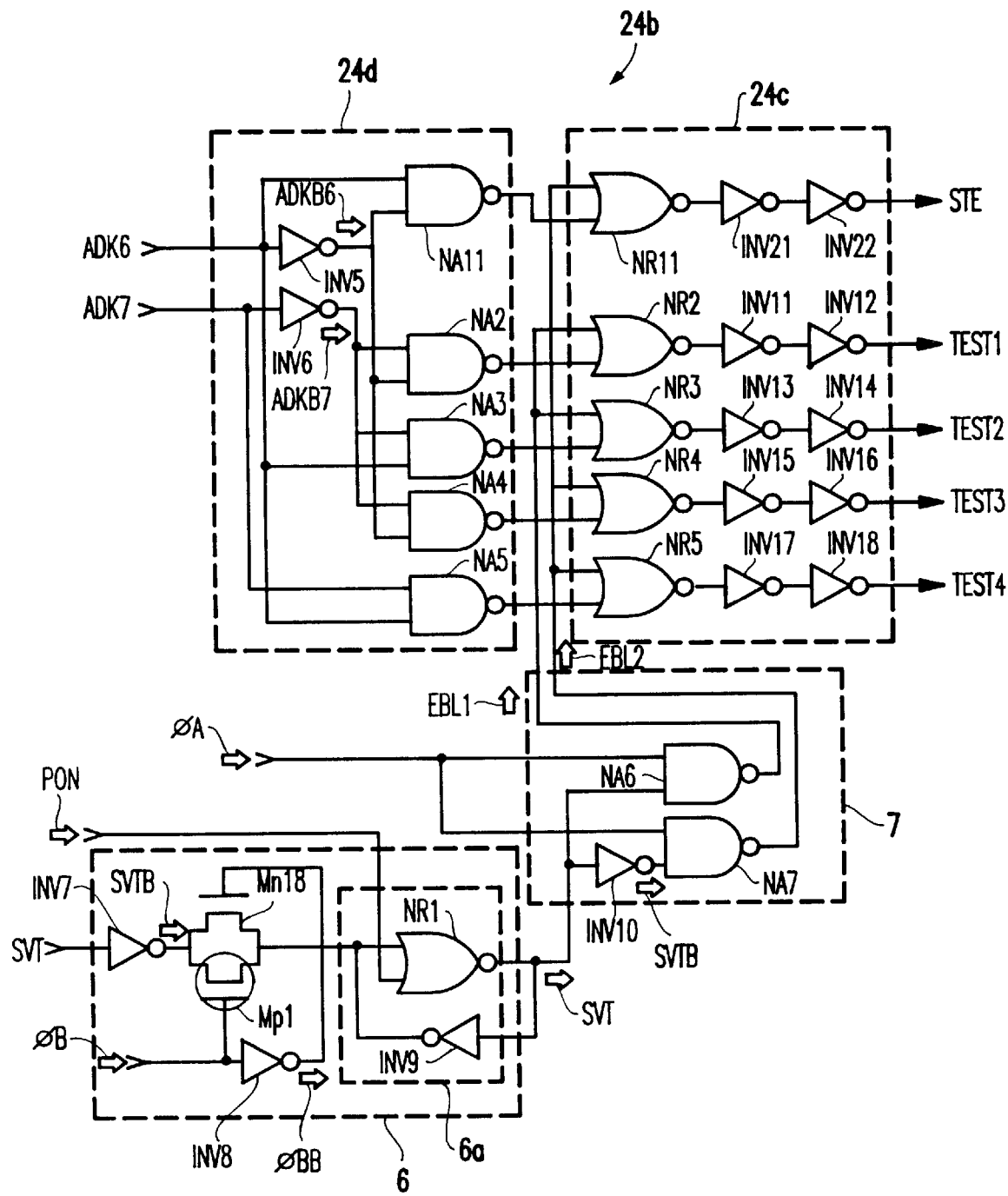
FIG. 6 is a circuit diagram showing the circuit configuration of a test signal generating circuit incorporated in the semiconductor memory device.

The test control signal generating circuit 24b is similar to the test control signal generating circuit 3b except for generation of a gate control signal STE, and FIG. 6 illustrates the circuit configuration of the test control signal generating circuit 24b. The test control signal generating circuit 24b includes a decoder 24d, a signal driver 24e, the latch circuit 6 and the timing generator 7. The latch circuit 6 and the timing generator 7 are described hereinbefore, and component elements are labeled with the same references as those in FIG. 4.

A NAND gate NA11 is added to the decoder 24d, and the complementary selecting signal ADKB6 and the selecting signal ADK7 are supplied to the input nodes of the NAND gate NA11. For this reason, when the selecting signal ADK6 is in the low level and the other selecting signal ADK7 is in the high level, the NAND gate NA11 produces the output signal of the active low level.

A series combination of NOR gate NR11 and inverters INV21/INV22 is incorporated in the signal driver 24e together with the circuit components of the signal driver 8. The output node of the NAND gate NA11 is connected to an input node of the NOR gate NR11, and the enable signal EBL2 is supplied to the other input node of the NOR gate NR11. If the selecting signals ADK6/ADK7 are indicative of a request for confirmation of the super voltage SV in the presence of the output enable signal OEB of the active low level, the NOR gate NR11 and the associated inverters INV21/INV22 changes a gate control signal STE to the active high level.

Figure 7:
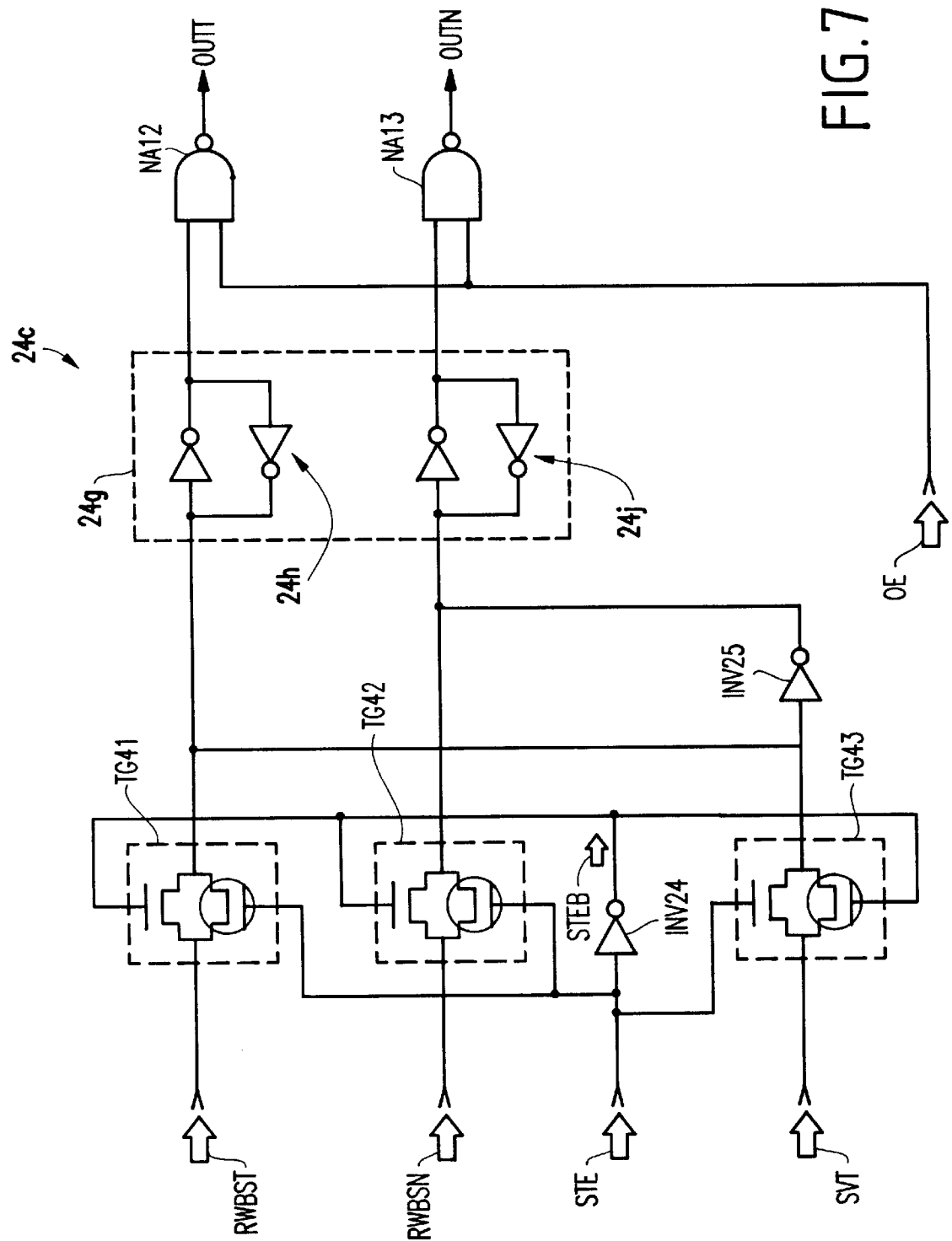
FIG. 7 is a circuit diagram showing the circuit configuration of a selector incorporated in the semiconductor memory device.

FIG. 7 illustrates the circuit configuration of the selector 24c. The selector 24c includes three transfer gates TG41, TG42 and TG43, a latch circuit 24g, NAND gates NA12/NA13 and inverters INV24/INV25. Each of the transfer gates TG41 to TG43 is implemented by a parallel combination of an n-channel type field effect transistor and a p-channel type field effect transistor, and the latch circuit 24g has two flip flop circuits 24h/24j. Data signals RWBST/RWBSN are complementary to each other, and are representative of a read-out data bit. The data signals RWBST/RWBSN are supplied to the transfer gates TG41/TG42, and the control signal SVT is supplied to the transfer gate TG43. The transfer gates TG41/TG42 are directly connected to the flip flop circuits 24h/24j of the latch circuit 24g, and the transfer gate TG43 is connected through the inverter INV25 to the latch circuit 24g. The inverter INV24 produces a complementary gate control signal STEB from the gate control signal STE, and the gate control signal STE and the complementary gate control signal STEB are supplied to the three transfer gates TG41, TG42 and TG43. The latch circuit 24g supplies the stored signal to the NAND gates NA12/NA13. The NAND gates NA12/NA13 are enabled with the output enable signal of the active high level, and supply the stored signal to the data buffer 22b.

The gate control signal STE and the complementary gate control signal STEB cause the transfer gate TG43 and the transfer gates TG41/TG42 to complementarily turn on and off. When the gate control signal STE is in the active high level, the transfer gates TG41/TG42 are turned off, and the transfer gate TG43 turns on so as to transfer the control signal SVT through the inverter INV25 to the flip flop 24j. On the other hand, when the gate control signal STE is in the low level, the transfer gate TG43 is turned off, and the transfer gates TG41/TG42 turn on so as to transfer the data signals RWBST/RWBSN to the flip flop circuits 24h/24j.

Figure 8A:
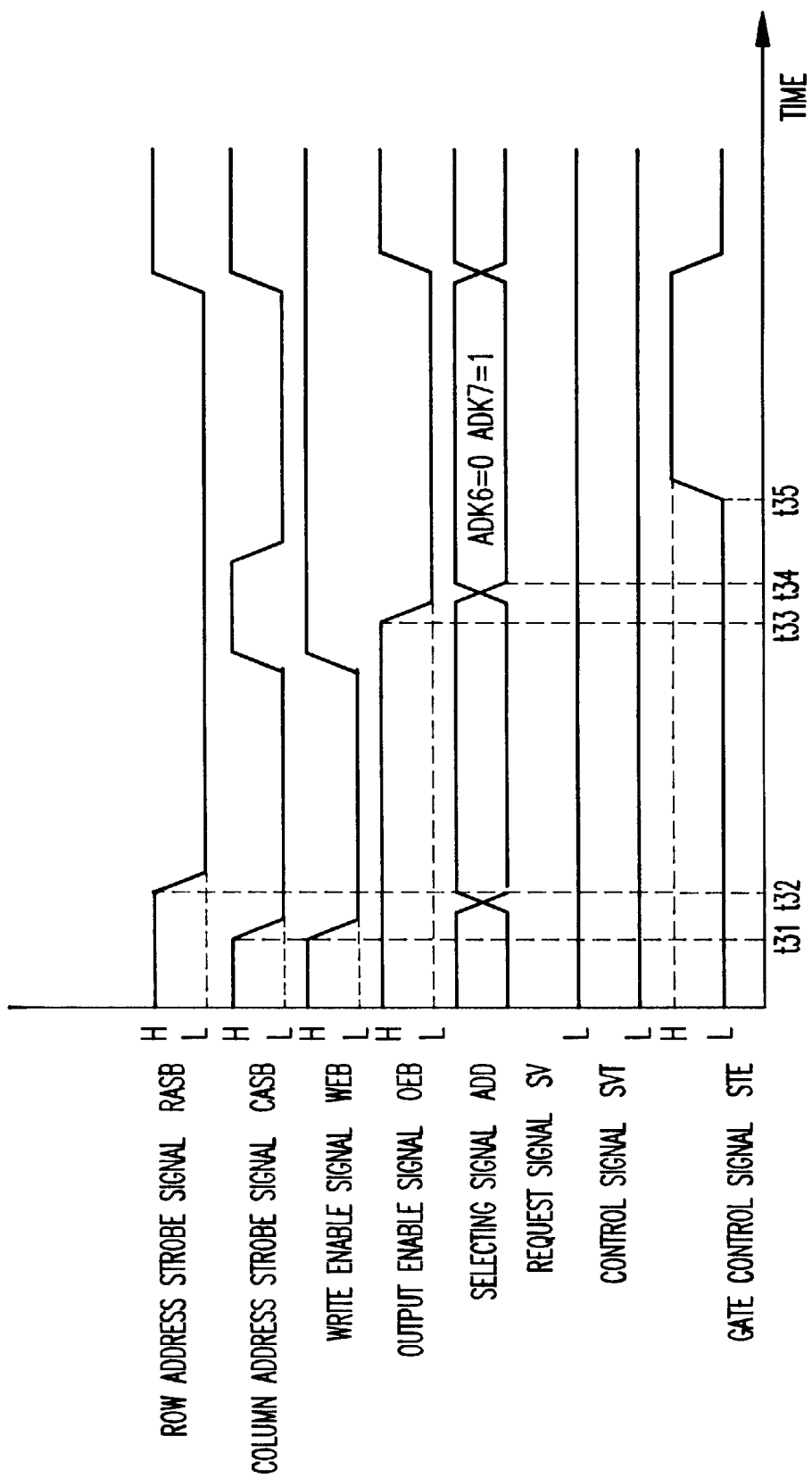
FIG. 8A is a timing chart showing an entry into a test mode.

FIGS. 8A. 8B and 8C illustrate the behavior of the semiconductor memory device according to the present invention. The semiconductor memory device enters into the test mode at the WE/CAS-Before-RAS timing. The column address strobe signal CASB and the write enable signal WEB are changed to the active low level at time t31, and, thereafter, the row address strobe signal RASB is changed to the active low level at time t32 (see FIG. 8A). Then, the semiconductor memory device enters into the test mode.

In order to check the control signal SVT to see whether the super voltage detecting circuit 24a surely detects the request signal of the super voltage "HH", the output enable signal OEB is changed to the active low level at time t33, and the selecting signal ADK6/ADK7 are changed to the low level and the high level, respectively. Then, the NOR gate NR11 is enabled with the signal EBL2, and the NAND gate NA11 changes the output signal to the low level. The NOR gate NR11 produces the output signal of the high level, and inverter INV22 changes the gate control signal to the active high level at time t35. Then, the transfer gate TG43 turns on, and the selector 24c becomes ready for transmission of the control signal SVT. Thus, the semiconductor memory device makes the selector 24c ready for transmission of the control signal SVT without the super voltage "HH", and the entry is sure.

The request signal SV for a self-diagnostic function is supplied to the signal pin T11, and is the super voltage "HH"

over the positive power voltage Vdd. If the super voltage detecting circuit 24a detects the super voltage "HH", the control signal SVT is changed to the active high level at time t42, and is supplied to the selector 24c. The output enable signal OEB is changed to the active low level at time t43, and the selector 24c transfers the control signal SVT to the data buffer 22b. The data buffer 22b changes the potential level at the signal pin 23 to the high level at time t44, and an analyst confirms the behavior of the super voltage detecting signal 24a.

If the potential level at the signal pin 23 is in the low level, the analyst increases the potential level of the request signal SV until the signal pin 23 is changed to the high level. In this way, the analyst can know the minimum super voltage detectable by the super voltage detecting circuit 24a, and applies the minimum super voltage at the entry into the self-diagnostic function. For this reason, the gate insulating layer of the component field effect transistors are less damaged.

The entry into any one of the self-diagnostic functions TEST1/TEST2 is similar to that of the prior art, and is not described hereinbelow for the sake of simplicity.

In order to exit from the test mode, the column address strobe signal CASB is changed to the active low level at time t51, and, thereafter, the row address strobe signal RASB is changed to the active low level at time t52 (see FIG. 8C). Then, the semiconductor memory device exits from the test mode. The exit timing may be the CAS-Before-RAS refresh timing.

After the exit from the test mode, the semiconductor memory device behaves as similar to the prior art semiconductor memory device in the standard mode.

In the above described embodiment, the memory cell array 21 and the peripheral circuits 22 as a whole constitute an internal circuit, and the memory cell array 21 serves as a data source. The request signal SV serves as a first external signal, and the selecting signals ADK6/ADK7 are corresponding to second external signals. The control signal SVT and the gate control signal STE serve as a first control signal and a second control signal, respectively, and the test control signal TEST1/TEST2 is corresponding to a test entry signal.

As will be appreciated from the foregoing description, the analyst can confirm the entry into the self-diagnostic function, and makes the semiconductor memory device to surely carry out the self-diagnostic function under the application of the super voltage "HH". Even if the threshold Vth is larger, the analyst can determine the minimum super voltage to be required for the entry into the self-diagnostic function, and makes the n-channel type load transistors less damaged.

Although a particular embodiment of the present invention has been shown and described, it will be obvious to those skilled in the art that various changes and modifications may be made without departing from the spirit and scope of the present invention.

For example, the present invention is applicable to any kind of semiconductor integrated circuit device with a self-diagnostic function.

The semiconductor memory device may exit from the test mode at the RAS-Only-Refresh timing.

What is claimed is:

1. A semiconductor integrated circuit device having a test mode and a standard mode, comprising:

an internal circuit carrying out a task in said standard mode and diagnosed in said test mode, and having a signal source for producing a data signal and a signal port;

a super voltage detecting circuit checking a first external signal to see whether or not said first external signal is out of a regular potential range, and producing a first control signal when said first external signal is out of said regular potential range;

a test control signal generating circuit responsive to second external signals for producing a test entry signal representative of a self-diagnostic function in the presence of said first control signal and for producing a second control signal changed between a first level and a second level in the absence of said first control signal; and a selector having a first port connected to said signal source, a second port connected to said super voltage detecting circuit and a third port connected to said signal port, and responsive to said second control signal for selectively transferring said data signal and said first control signal to said signal port.

2. The semiconductor integrated circuit device as set forth in claim 1, in which said selector includes a first transfer gate unit connected between said signal source and said signal port and responsive to said second control signal and a second transfer gate unit connected between said super voltage detecting circuit and said signal port and responsive to said second control signal so as to be changed between on-state and off-state complementarily to said first transfer gate unit.

3. The semiconductor integrated circuit device as set forth in claim 2, in which said signal source is a memory cell array, and said signal port is a data port for outputting a read-out data signal.

4. The semiconductor integrated circuit device as set forth in claim 3, in which said memory cell array is implemented by dynamic random access memory cells.

5. The semiconductor integrated circuit device as set forth in claim 1, in which said super voltage detecting circuit includes a logic gate for producing said first control signal and a series of load transistors connected between an input node of said logic gate and a signal pin supplied to said first external voltage.

* * * * *